United States Patent
Fechalos et al.

(10) Patent No.: US 7,772,852 B2
(45) Date of Patent: Aug. 10, 2010

(54) BATTERY STRING PERFORMANCE MEASUREMENT

(75) Inventors: William Fechalos, Naperville, IL (US); N. William Conrardy, Elmhurst, IL (US)

(73) Assignee: C & C Power, Inc., Elmhurst, IL (US)

( * ) Notice: Subject to any disclaimer, the term of this patent is extended or adjusted under 35 U.S.C. 154(b) by 485 days.

(21) Appl. No.: 11/135,688

(22) Filed: May 24, 2005

(65) Prior Publication Data

US 2006/0017444 A1 Jan. 26, 2006

Related U.S. Application Data

(60) Provisional application No. 60/590,283, filed on Jul. 21, 2004.

(51) Int. Cl.
*G01N 27/416* (2006.01)
(52) U.S. Cl. .................................. 324/430; 324/426
(58) Field of Classification Search .......... 320/123, 320/149, 116, 151, 158, 159, 161, 110, 111, 320/DIG. 19, DIG. 21, DIG. 22; 324/426, 324/430, 433, 446, 429, 435, 436
See application file for complete search history.

(56) References Cited

U.S. PATENT DOCUMENTS

| | | | |
|---|---|---|---|
| 3,387,210 A * | 6/1968 | Wolgast | 324/715 |
| 3,517,766 A * | 6/1970 | West | 180/65.4 |
| 3,593,132 A * | 7/1971 | Houck et al. | 324/102 |
| 3,959,108 A * | 5/1976 | Plumpe, Jr. | 204/406 |
| 4,357,574 A * | 11/1982 | Takamisawa et al. | 324/72.5 |
| 4,697,134 A | 9/1987 | Burkum et al. | |
| 4,707,795 A | 11/1987 | Alber et al. | |
| 4,795,884 A * | 1/1989 | Carroll | 219/497 |
| 4,912,416 A * | 3/1990 | Champlin | 324/430 |
| 5,206,578 A * | 4/1993 | Nor | 320/118 |
| 5,281,920 A | 1/1994 | Wurst | |
| 5,291,142 A * | 3/1994 | Ohmi | 324/719 |
| 5,457,377 A | 10/1995 | Jonsson | |
| 5,546,003 A | 8/1996 | Noworolski et al. | |
| 5,572,136 A * | 11/1996 | Champlin | 324/426 |
| 5,589,757 A * | 12/1996 | Klang | 320/160 |
| 5,670,861 A | 9/1997 | Nor | |
| 5,703,469 A | 12/1997 | Kinoshita | |
| 5,705,929 A * | 1/1998 | Caravello et al. | 324/430 |
| 5,710,503 A | 1/1998 | Sideris et al. | |
| 5,721,481 A * | 2/1998 | Narita et al. | 320/111 |
| 5,773,958 A * | 6/1998 | Gow et al. | 320/118 |
| 5,821,757 A | 10/1998 | Alvarez et al. | |
| 5,923,148 A | 7/1999 | Sideris et al. | |
| 5,969,625 A | 10/1999 | Russo | |
| 6,037,778 A * | 3/2000 | Makhija | 324/433 |

(Continued)

*Primary Examiner*—Edward Tso
*Assistant Examiner*—M'Baye Diao
(74) *Attorney, Agent, or Firm*—Brinks Hofer Gilson & Lione

(57) ABSTRACT

A DC power supply system in which the resistance of a battery is measured. The voltage of the DC power supply is reduced such that the battery supplies some current to the load, and the voltage and current are measured. The voltage of the DC power supply is further reduced such that the battery supplies increased power to the load, and the voltage and current are measured. A resistance value is computed, and may be compared with various pre-established criteria. The battery resistance may also be measured by comparing the charging time of a known resistive-capacitive circuit with the charging time established at a prior measurement epoch.

24 Claims, 6 Drawing Sheets

U.S. PATENT DOCUMENTS

| | | | |
|---|---|---|---|
| 6,072,300 A * | 6/2000 | Tsuji | 320/116 |
| 6,087,808 A * | 7/2000 | Pritchard | 320/132 |
| 6,094,030 A | 7/2000 | Gunthorpe et al. | |
| 6,160,382 A * | 12/2000 | Yoon et al. | 320/136 |
| 6,307,378 B1 | 10/2001 | Kozlowski | |
| 6,310,481 B2 * | 10/2001 | Bertness | 324/430 |
| 6,316,914 B1 | 11/2001 | Bertness | |
| 6,384,608 B1 * | 5/2002 | Namaky | 324/430 |
| 6,417,668 B1 * | 7/2002 | Howard et al. | 324/426 |
| 6,477,024 B1 | 11/2002 | Kikuchi et al. | |
| 6,509,718 B2 * | 1/2003 | Sakai et al. | 320/134 |
| 6,765,388 B1 * | 7/2004 | Clegg | 324/426 |
| 7,129,675 B2 * | 10/2006 | Brecht | 320/137 |
| 2002/0161537 A1 | 10/2002 | Odaohhara | |
| 2002/0180445 A1 * | 12/2002 | Bertness et al. | 324/426 |
| 2002/0196025 A1 * | 12/2002 | Freeman et al. | 324/426 |
| 2003/0020478 A1 * | 1/2003 | Scott | 324/426 |
| 2003/0128036 A1 * | 7/2003 | Henningson et al. | 324/426 |
| 2003/0214303 A1 * | 11/2003 | Ying | 324/426 |
| 2004/0076872 A1 * | 4/2004 | Kinoshita et al. | 429/61 |
| 2004/0128089 A1 | 7/2004 | Barsoukov et al. | |
| 2005/0151509 A1 * | 7/2005 | Cook | 320/116 |

* cited by examiner

BATTERY STRING PERFORMANCE MEASUREMENT

RELATED APPLICATIONS

The present patent application claims the benefit of the filing date under 35 U.S.C. §119(e) of Provisional U.S. Patent Application Ser. No. 60/590,283, filed Jul. 21, 2004, which is hereby incorporated by reference.

FIELD OF THE INVENTION

This application may have relevance to the monitoring of the status of rechargeable batteries as used in power supply systems.

BACKGROUND

Direct current (DC) power is needed for many types of telephone communication equipment, for control equipment used at electric utility substations and power plants and other similar uses. The DC power may be supplied by a DC power source which may be supplied with alternating current (AC) power from an AC power source, such as the local power grid or a generator and prime mover. Standby batteries are utilized as a backup DC power source when the DC power source either cannot supply all of the power required by the components or when the AC power supply or other external power source is not available, as during a power failure at the local electric utility. The period of time where such battery backup is required may be reduced by providing local diesel electric or turbine powered electric generators. However, during the time where the other backup power sources are unavailable or are being brought into service, batteries are needed. Since the occurrence of power outages is normally infrequent, the condition of the batteries during the times when they are not actively providing the backup power is not known.

A storage battery has an internal impedance, which includes resistive, inductive and capacitive components. When the battery is discharging, DC performance is involved and the resistive component of the impedance is of interest as the discharge current produces a voltage drop across the internal resistance of the battery in accordance with Ohm's law. Over the life of the battery the internal resistance will increase, at a rate determined by such factors as how many times the battery undergoes cycles of discharging and recharging, and other factors. The internal resistance of a battery will eventually increase to a level where the voltage drop across the internal resistance during discharge is so great that the battery can no longer deliver power at its rated capacity. Other defects in the battery or aging of the battery may also result in degradation of the capacity of a battery to perform its function.

When strings of batteries are used to increase the voltage being supplied, or in general when batteries are connected in either series or parallel, the impedance of the overall string has an influence on the amount of energy that can be supplied. Other components of the physical assembly, including connecting links, terminal connections and the like which can exhibit resistance, and whose characteristics may vary with time, due to such factors as corrosion and changes in contact pressure, also contribute to the resultant battery status.

SUMMARY

This application may relate to a method and apparatus for measuring and monitoring the general condition of one or more battery strings and the ability of the battery strings to provide power in the case of a power outage, or in other circumstances where the DC power supply does not provide the total load current required. Although the absolute value of the resistance of a battery string is a factor in overall battery performance, another meaningful characteristic may be the change of resistance with time. When first installed, battery strings may be evaluated for individual battery resistance and overall string resistance, and the installation accepted if the determined values fall within pre-established limits. The evaluation of a battery string after service has commenced may be more difficult and thus may not be performed. In particular, measurement of the variation of resistance with time over a period of days to years, and which is of relevance, may not be performed.

In a DC power system comprising a DC power supply and batteries, ultimately deriving energy from another source such as an electric utility, with batteries connected in series to achieve a desired terminal voltage, and with batteries which may be connected in parallel to increase the overall power capacity, the resistance of a serial battery string may be measured by using capabilities often already existing in the DC power supply, such as control of output voltage along with the measurement of current at specific locations. Such control may be affected by a stored-program microprocessor, a supervisory computer system, a control interface, or manual manipulation of parameters by a control knob or similar device.

In an aspect, the measurement may be initiated manually or automatically and at prescheduled intervals, and the results compared with preset alarm thresholds to determine if such thresholds are reached, where the quantities which may be determined include the battery string resistance, the percentage change in a parameter between successive measurement cycles, and the change with respect to a baseline. The results may be displayed on a visual display, such as a meter or indicator lights, an alphanumeric device or a video monitor, an audible alarm may be sounded, and a report to a supervisory system may be made via a connecting link.

The DC power system may have a source of DC power, such as an AC-powered DC-output supply where the output voltage may be adjusted by varying a control. The DC power supply may provide some or all of the current required by the load, so long as the input power source is available. The DC power supply may also used to provide charging current to the batteries that would be required to recharge the batteries after a full or partial discharge of the batteries. This DC power supply may also serve to maintain the battery charge state through trickle charging. Such a system may also have shunts to measure the DC power supply output current and the current that is delivered to the load by one or more battery strings. The battery current measurement has two polarities, corresponding to states where the battery is being charged and being discharged. The designation of polarity depends on the position of the current measuring device. By measuring the current flowing from the battery string and the supply voltage, the resistance of a battery string can be measured. This resistance may be the total resistance of the battery string, including all of the series elements used to connect the batteries in the system (e.g., cables, connectors, shunts, disconnects, circuit breakers and fuses). Where the term "battery resistance" or the like is used, unless otherwise stated, the term means the series resistance of a battery or a string of batteries connected in series, including the series elements connecting the battery string. The resistance of elements not in the main current path between the battery and the electrical load are not included in the battery resistance.

Whether the measurement is initiated manually or automatically, the resistance measurement may be compared with a previous result, or an absolute or relative threshold, and an alarm generated if the measurement exceeds a preset or computed threshold. The result may also be stored in non-volatile memory in the local microprocessor, or at an external device or system or be displayed. The computation of the resistance and comparison with the thresholds need not be performed at the DC power supply or battery rack; only the measurement of voltages and currents may be performed locally.

The battery string resistance may be defined as the change in battery terminal voltage, divided by the change in battery current, in accordance with Ohm's law. The resistance measurement is performed by reducing the DC power supply voltage from a high voltage, often termed the float voltage, which may be used for battery charging, to a lower voltage such that the batteries begin to supply some of the load current. Battery string voltage and current readings may be taken at the float voltage to initialize the measurement. An initial reduction in voltage may be made such that the battery begins to supply a small amount of current to the load circuit and the current measured. The DC power supply voltage is then reduced substantially below the battery voltage, causing the battery to supply a substantial fractional percentage of the required load current. The battery string current and string voltage are again measured. The battery string resistance is computed as the ratio of the change in battery string current to the change in battery string voltage, and compared with previous measurements or preset or pre-computed thresholds. The measured values are stored for future use, and any alarms indicated by the comparisons are generated and communicated.

The accuracy of the resistance measurement may be limited by a characteristic of batteries, such as lead-acid batteries when subjected to a load, to display a sudden drop in terminal voltage followed by a slow rise in voltage. This may be mitigated by managing the rate of change of load current increase from the batteries, for example, by controlling the rate of decrease of DC power supply voltage. In an aspect, the voltage may be reduced such that the battery supplies no more than about 10 percent of the overall load current. Further gradual reduction of the DC power supply voltage may be made in increments, or continually, such that the battery strings supply approximately half of the expected load current. For some lead-acid battery types, a time interval of five minutes may be satisfactory. At this juncture, an initial test voltage and current may be measured, the DC power supply voltage then substantially reduced, and both the battery string voltage and current again measured. By managing the rate of change of the current supplied by the battery during the initial discharge, the transient voltage effects at the beginning of the discharge may be reduced and the accuracy and repeatability of battery string resistance measurements may be improved.

In another aspect, individual battery strings of a series parallel arrangement may be tested without the necessity to change the DC power supply voltage. Each battery string may be provided with a disconnect switch to provide for servicing the battery string independently of the remainder of the battery backup system, and that disconnect switch may be a double pole single throw switch. In an operational state, the switch is in a position such that the battery string is connected to the system to which power is being supplied. However if the switch is thrown to the other position, the battery may be disconnected from the system and connected to a separate load. In a similar manner, the battery string voltage may be measured after the load has been adjusted such that the battery is supplying a first predetermined percentage, e.g., about 10 percent, of a predetermined maximum load current, the maximum load current being determined on the basis of the specific system configuration. A similar time-dependent protocol to that previously described is initiated with respect to the load current, until the battery is supplying a second predetermined load current and the battery string voltage measured. The load parameters may now be rapidly adjusted to increase the load current to a third predetermined load current and the battery string voltage measured. The battery string resistance may be computed as previously described by the change in voltage divided by the change in current, and processed in a similar manner.

During the course of the measurement cycle, other indicators of battery condition may be monitored, such as the relationship of battery current to DC power supply voltage during the initial voltage reduction, and during the rapid voltage reduction and evaluated against predetermined thresholds to identify potential failure modes that may have occurred between the battery test cycles. In such an instance, the test may be aborted, the indication of failure mode communicated, and the associated data stored.

In yet another aspect, the resistance of the battery string may be measured by measuring the charging time of a known resistive-capacitive circuit. An initial measurement of the charging time may be recorded, and subsequent measurements of the charging time compared with the initial charging time. The increase in charging time is related to the increase in battery circuit resistance. This increase may be displayed as a visual indication or communicated to a supervisory system. A single measurement apparatus may be associated with each battery string, or the apparatus may be connected to multiple strings using switches. The accuracy may be increased by first applying a load to the battery string being tested, as previously described.

DETAILED DESCRIPTION

Figure 1:
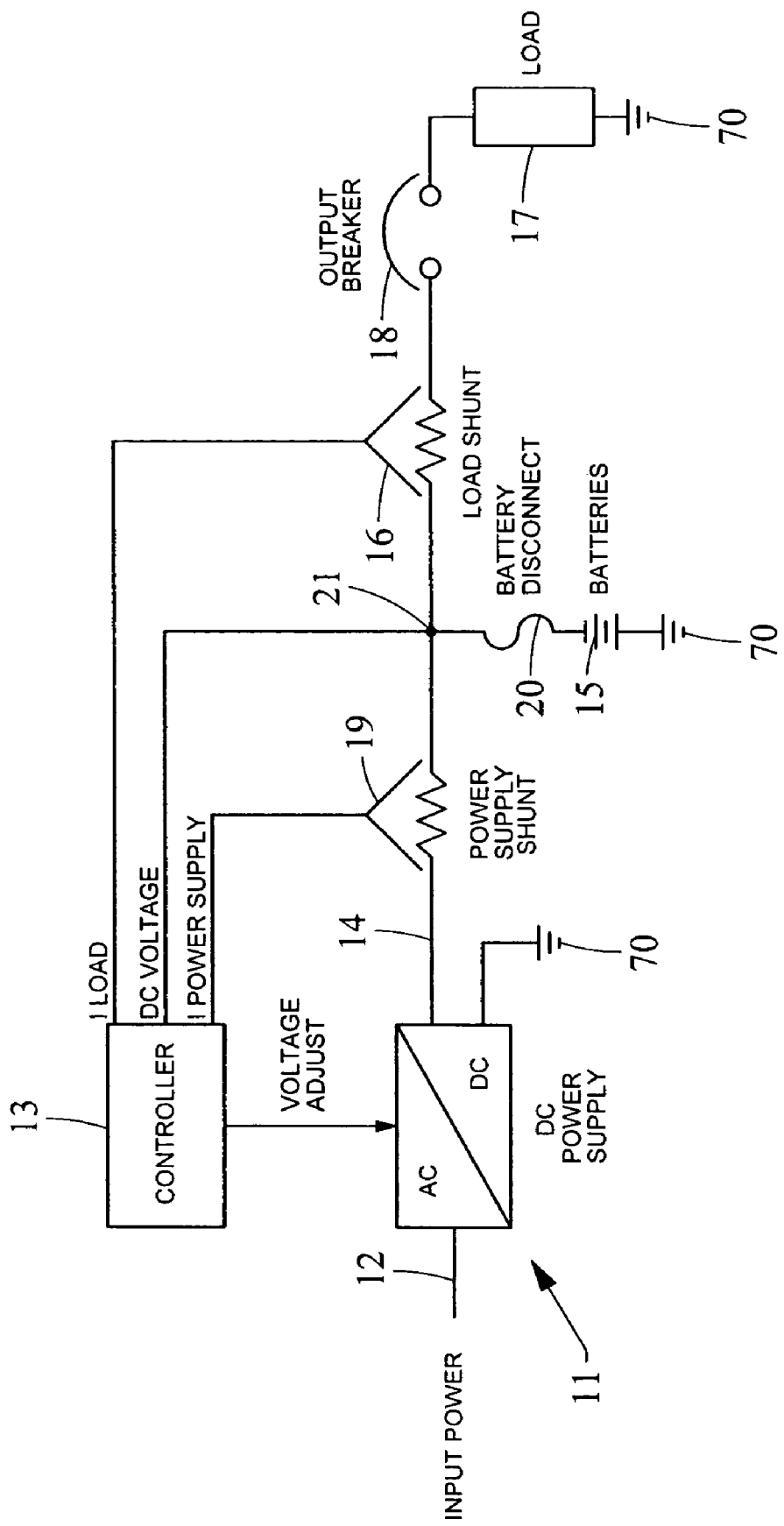
FIG. 1 is a simplified block diagram of a DC power supply incorporating a battery string.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as set forth by the claims.

The same elements or parts throughout the figures of the drawings are designated by the same reference characters. Herein, a voltmeter is an instrument or means, as is known in the art, for measuring in volts the differences in potential between different points of an electrical circuit; and, an ammeter is an instrument or means, as is known in the art, for measuring electrical current in amperes.

FIG. 1 illustrates a DC power supply system arranged so as to make voltage and current measurements suitable for determining the resistance of a battery string. It will be appreciated that other arrangements of the current and voltage measurement devices will yield equivalent results within the accuracy required.

A DC power supply 11 is supplied with input power 12, such as AC from a local utility supply. Other sources of electrical energy are equally usable, including DC power input. Functions of the DC power supply 11 may be monitored and controlled by a controller 13; the functions may include control of the DC voltage output 14 of the DC power supply 11 and the measurement of the DC voltage of the battery string at node 21, the power supply current by power supply shunt 19 the load current at load shunt 16. The current flowing to or from the battery 15 may be determined by these two current measurements by the application of Kirchhoff's current law, where the sum of current into a node is zero.

The output current, as measured by the voltage developed across the load shunt 16 may supplied to the load 17 through a circuit breaker 18 or a fuse. The battery may be a serial battery string 15 and connected to a junction between the load shunt 16 and a power supply shunt 19 through the fuse or battery disconnect switch 20. The battery string 15 may be comprised of one or more batteries such that the voltage between the node 21 and ground 70 is that used by the load 17. In an instance where a 48-volt supply is used, four 12-volt batteries may be connected in series. As discussed later, the total current capability of such a supply may be increased by connecting two or more batteries or battery strings in parallel. The resistance measurement technique can be applied to each of the batteries or battery strings by employing additional current shunts, and may be further supplemented by additional voltage measurement points.

Figure 2:
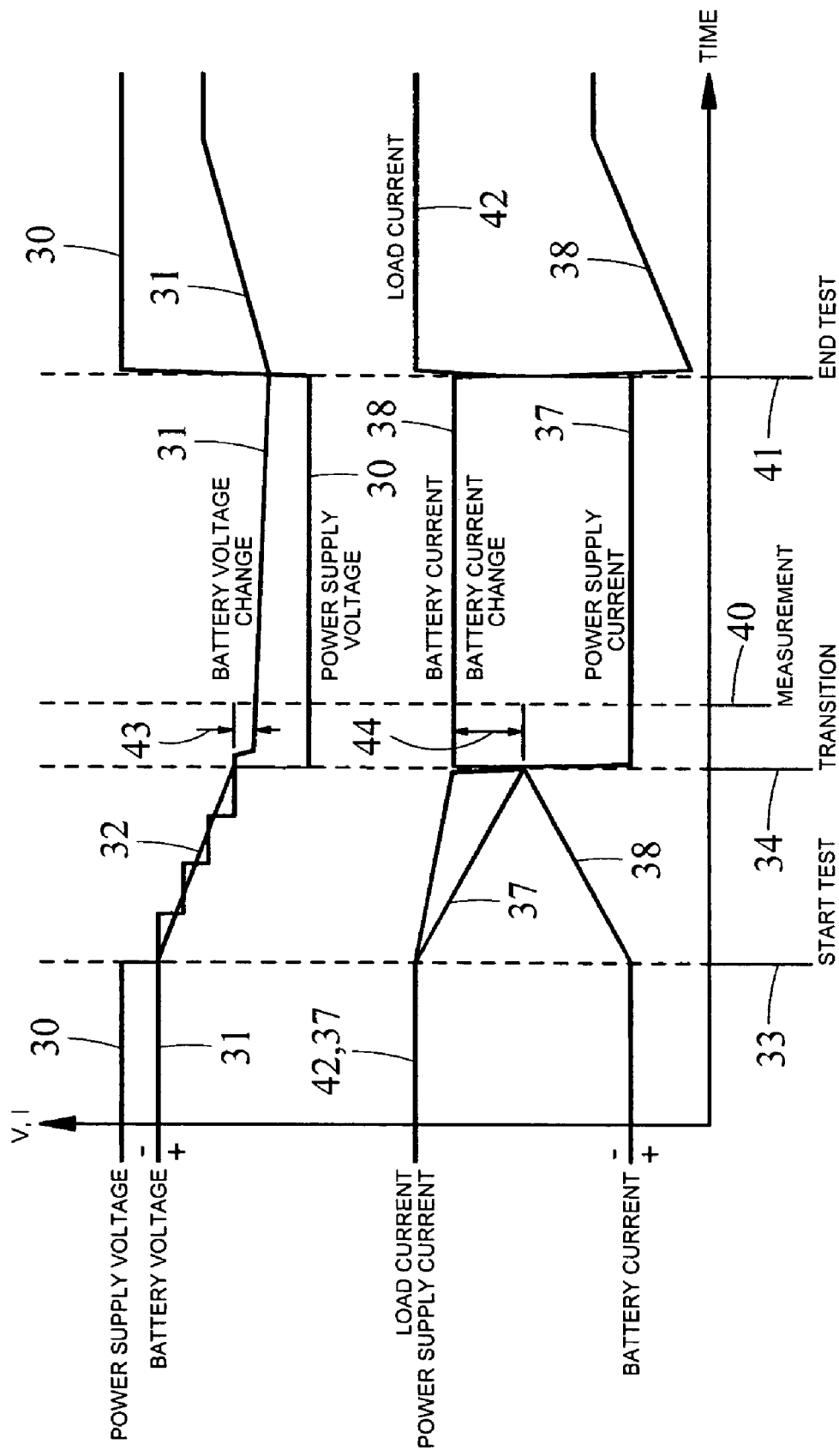
FIG. 2 shows the relationship between the current in a battery string and the power supply and battery voltage during a battery string resistance measurement cycle.

Aspects of the measurement process are shown in FIG. 2. Prior to the start of the test, voltage 30 at the output 14 of the DC power supply 11 may be maintained higher than the battery string voltage 31. In this state, the DC power supply 11 provides all of the current required by the load 17 and any current that maintains the batteries 15 at a fully charged state.

When the test 33 is initiated, the voltage 14 at the output of the DC power supply 11 is lowered such that it is approximately equal to the battery string terminal voltage 31, and the batteries 15 begin to supply current to the load 17. During a time interval between a test start 33 and a transition point 34, the DC supply voltage is reduced further in a continuous or stepwise manner 32. In this state, the DC power supply 11 supplies less of the current 42 flowing to the load 17 and the battery string 15 supplies more of the current 42 flowing to the load 17. After the elapse of a predetermined time, reaching a transition point 34, the DC power supply 11 and the battery string 15 may each be supplying approximately equal current 37, 38 to the load 5. The battery string terminal voltage 31 is measured. The DC power supply voltage 30 may now be reduced to a low value such that the battery string current 38 becomes substantially equal to the load current 4. In this state, both the battery terminal voltage at node 21 and the battery string current 38 are measured at a measurement time 40. The resistance of the battery string may then be computed based on the change in battery string terminal voltage 43 and the corresponding change in battery string current 44. After completion of the measurement, the DC power supply voltage 30 may be increased to the value which obtained prior to the commencement of the test at time 33. The DC power supply 11 again supplies all of the required current, including the load current 42 and the current that is required to recharge the battery string 15. The recharging period is illustrated in FIG. 2 by the positive excursion in battery current 38 at the end of the test 41 and which declines in value with time after. (Note that a battery supply system providing for a positive ground has been illustrated, and increasingly positive values of voltage and current are measured towards the origin.)

The choice of battery test load current 43, and the time duration between the start test state 32, the transition state 34, the measurement state 40, and the end test state 41 may depend on the specific installation of each DC power system, although nominal values may be initially established to facilitate construction and testing. As an example, but not by way of limitation, a lead-acid nominal cycle may be comprised of rapidly reducing the DC power supply voltage (as measured at common point 21) such that the battery string begins to supply current to the load. The initial current from the battery string may be limited to about 10 percent of the maximum design load current. The DC power supply voltage may then be gradually reduced, over a period of approximately 5 minutes, such that the battery string supplies approximately 50 percent of the maximum load current 42. In this state, the DC power supply 11 and the battery string 15 are sharing the load current 37, 38. The DC power supply voltage 30 and the battery string current are measured 38. Then the DC power supply voltage 30 is rapidly reduced such that it is substantially lower than the battery string voltage 31, and the battery string 15 is caused to supply essentially all of the required load current 42. When this occurs, the battery string voltage 31 is measured at the common point 21, and the battery string current 38 is also measured. Once the measurement has been completed, the DC power supply voltage 30 may be returned rapidly to a state where it exceeds the battery string voltage 31, and the DC power supply 14 provides the load current 42, and any current used to recharge the battery string 15. The battery string resistance is computed from the measurements of the change in battery voltage and the change in battery current as previously described.

Figure 3:
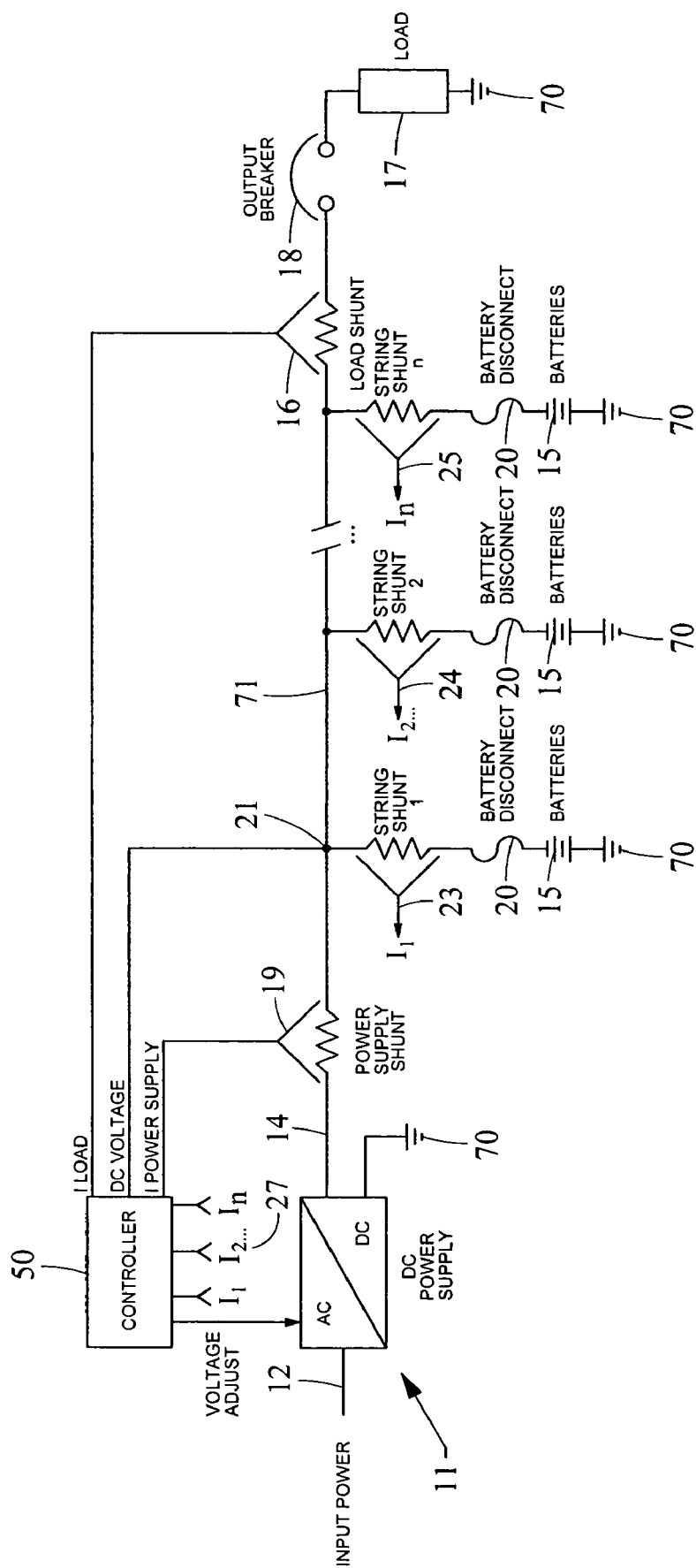
FIG. 3 is a simplified block diagram of a DC power supply incorporating multiple battery strings.

In another aspect, multiple batteries or battery strings may be connected in parallel to achieve higher overall load current capacity or longer back-up power supply time. An arrangement of battery strings 15 is shown in FIG. 3, where each of the battery strings 15 comprises multiple batteries, where two or more separate batteries may be connected in series (not shown) to achieve the voltage used by the load 17, a battery disconnect switch or fuse 20 and a string shunt 23, 24, 25, connected in series with the each of the battery strings and disconnect switches 10. The voltage developed across each string shunt 23, 24, 25 is measured by the controller 50 or some other apparatus capable of measuring voltage, and is a measure of the current flowing in the corresponding battery string 15. In this example, the controller 13 has input terminals 27 for the voltages developed across the shunts. In this arrangement, the voltage of each battery string is substantially identical, except for wiring resistance drops in the bus 71, and may be measured at a common point 21. The battery string resistance may be measured previously described. In this situation, it should be understood that the currents supplied by the individual battery strings 15 will differ from each other due to their differing battery string resistances. A measurement cycle referenced to one battery string may result in different current measurements from another string at each stage of the measurement cycle.

During the measurement cycle, the DC power supply voltage 11, as measured at common point 21, is reduced such that it is equal to the nominal battery string voltage, and each of the battery strings 15 will begin to supplement the DC power supply 11 in delivering current to the load 17. The DC power supply voltage output 14 may then be gradually reduced until the battery strings 15 are each supplying approximately half of the intended load current required by the load 17. At this juncture (the transition state 34), the current of each battery string 15 is measured by the voltage drop across associated shunt 23, 24, 25 and the common voltage is measured at common point 21. The DC power supply voltage is then rapidly reduced such that a substantial portion of the current 42 is now supplied to the load 17 by the battery strings 15, and the DC power supply 11 contributes little to the overall current supply. The common voltage is again measured at common point 21, and the individual battery string currents measured by the associated string shunts 23, 24, 25. In this arrangement, the current flowing in each battery string 15 is directly measured by the string shunt 23, 24, 25 in the battery string 15 and, using the common voltage measurement, the change in voltage and the change in current for each string is used to compute the resistance of each battery string 15 individually. Once the measurements have been made and the test is ended 41, the DC voltage 30 of the power supply 11 is raised rapidly so that it exceeds that of the battery strings 31, so that the discharge process is terminated, and the batteries of the battery string 15 may be brought back to a fully charged state. Evaluation of the resistance measurement with respect to time-rate-of-change of resistance, pre-computed thresholds, or other measure of battery performance may be performed in a manner similar to that previously described.

The charge state of the battery strings 15 may influence the battery string resistance. The state of charge of the batteries may be determined by the current and voltage data measured by the controller 13, or by measuring the duration of input power outages or similar means, and a battery resistance measurement cycle 33, 34, 40, 41 may be delayed by a specified amount of time for each time interval where the battery was in a discharging state. For example, but not by way of limitation, the battery resistance measurement cycle may be delayed by one hour for each minute of battery discharge, so that the battery string resistance may be measured when the battery strings are in a consistent charge state.

In another aspect, a method of measuring battery string performance comprises determining a baseline reading of battery string resistance, which is taken at the initial installation, or when batteries have been replaced. This resistance reading may be used as a reference for comparing subsequent readings with a user determined and programmed percentage change as a measure of whether a problem with the battery exists. Upon completion of a battery string resistance test cycle, the results of the test may be displayed or otherwise communicated. A display may show the measured value and the percent change from the baseline, or the percent change from the previous reading, or both. While the display may not be continuous, the results of at least the last test may be retained and may be recalled as needed.

In the situation where a resistance measurement or other parameter exceeds the baseline value by a preprogrammed percentage, a Battery Alarm is created. The Battery Alarm may be displayed or otherwise communicated to the control system or a user, and may be accompanied by such data as the measured battery string resistance value, and the percentage change from the baseline value or previous value, as appropriate. If an audible or visual alarm signal is produced, the alarm may be silenced by a manual intervention by the user, such as depressing a key, or after a predetermined period of time. The data associated with the alarm, such as time, identification of battery string, and measured data may be stored or otherwise communicated for future retrieval.

The battery string resistance test cycle 33, 34, 40, 41 can be either automatically or manually initiated. The automatic test may be at user programmable intervals, such as once every specified number of weeks.

In another aspect, the battery string resistance measurement is a system, which may comprise the DC power supply 11, interconnecting cables such as those which may be inserted between the battery and the shunt and the bus 71 and the like, current and voltage measurement devices, connections to one or more battery strings 15 and to an external load 17, a stored-program computer (not shown) having the capability of controlling the DC power supply voltage 14, and either measuring the battery string current and voltage, or receiving data from which the current and voltage can be computed. The system may also comprise a display for presenting the computed resistance, the analysis of the computed resistance and alarms, and it may have a data interface for communicating with an external device which may receive the results of the computations, initiate the computations, or the like. Further, the system may comprise a keyboard or touch sensitive input device for operator control of some or all of the controllable system functions.

The battery string resistance tests described previously have been described for situations where the battery strings are operating satisfactorily, and have not as yet experienced a failure. In the event that a battery string exhibits an identifiable fault or anomaly, the test may be aborted in order to mitigate any damage to the equipment that may be caused by such fault or anomaly. By way of example and not limitation, situations where the test cycle may be terminated, or aborted, before normal completion may be:

1. In a 48 volt supply system, when the DC power supply voltage is decreased to a point where the battery string may be expected to supply 5 amperes and the battery string current has not reached 5 amperes, the test may be aborted and an alarm generated.

2. When the DC power supply voltage is gradually being reduced towards the state in which battery string may be expected to supply half of the load current, and the battery current has not reached, within a predetermined tolerance, half of the load current, the test may be aborted and an alarm generated.

3. During the measurement interval, where the DC power supply voltage is being maintained lower than the voltage necessary for the battery string to supply the load current required for the measurement, and the DC power supply current increases by more than a predetermined amount, the test may be aborted and an alarm generated.

In a manner similar to situations where the test has proceeded to normal completion, indications of an abnormal situation may be displayed or communicated, an audible alarm initiated, and the measured values stored for retrieval.

In yet another aspect, battery performance may be based on measuring the time T1 taken for a battery to charge a fixed capacitor C through a fixed resistor R to a predetermined percentage of the applied voltage V. A test may have been performed previously, such as at the time that the battery was installed, and resulted in a charging time T0. The present charging time T1 is compared with the original charging time T0, each time being that associated with charging the capacitor C to the same percentage of the applied voltage. The external resistor R and the capacitor C are fixed in value, and a change in the charging time may be attributed to a change in the battery internal resistance Rb, or a change in the resistance of the connections in the battery circuit. An increase in the charging time would indicate that there has been an increase in the battery resistance as the charging time is proportional to the total resistance in the circuit.

The use of an R-C circuit to measure the battery circuit resistance may reduce the amount of power supplied by the battery during the measurement cycle, when compared with the discharge through a purely resistive load. This may reduce the amount by which the battery is discharged during the measurement cycle and more power would be available should the battery be used as a back-up power supply during, or shortly after, the measurement cycle.

The maximum current drawn from the batteries is a function of the value of R in the series R-C circuit that is switched across the battery to perform the resistance measurement. The duration of the discharge is a function of the time constant of the R-C network (including the battery and connection circuit resistances). In this discussion, the internal resistance of the battery Rb is preferably smaller than the external resistance R. It would be easy for one skilled in the art to take account of the internal resistance on the measurement process.

It is a well known property of a R-C circuit with an applied voltage V, and the resistor R in series between the voltage source and the capacitor C, that the voltage across the capacitor C is given by an exponential relationship having a time constant RC such that, for example if the time constant RC is 1 second, the voltage Vc appearing across the capacitor C is 0.3935V, where V is the applied voltage, when the elapsed time since the application of the voltage is 0.5 seconds.

If RC is fixed and the measurement time is an elapsed time of 0.5 seconds after the voltage of the battery is applied, and a comparator threshold is set at 0.3935V, then the change in battery circuit resistance is proportional to the increment of time greater than 0.5 seconds it takes for Vc to reach the voltage threshold. By measuring the incremental time, the change in resistance can be determined. Using the percentage of the applied voltage to determine the threshold, accounts for the expected drop in the applied voltage as the battery supplies current through the internal resistance Rb.

Figure 4:
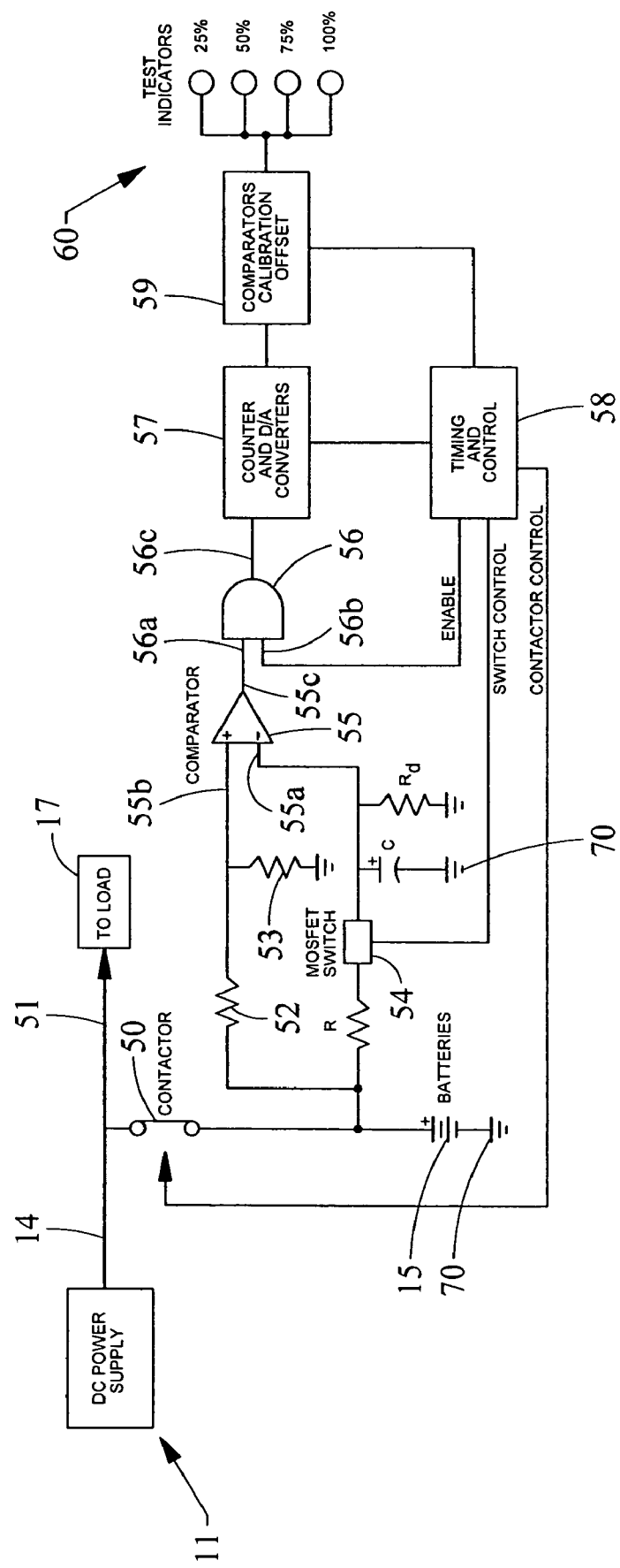
FIG. 4 is a simplified block diagram of an apparatus for measuring the battery string resistance by measuring the charging time of a RC circuit.

FIG. 4 illustrates a circuit which may be used to perform the measurement. A DC power supply 11, similar to that in FIG. 1 is used to provide the power for the external load 17, and to charge the battery string 15. Only one battery is shown, however, multiple battery strings may be connected in parallel as previously described to increase the overall current capacity, and multiple batteries connected in series in order to increase the voltage being supplied to the electrical load.

A comparator 55 has an input 55a associated with the voltage appearing across the capacitor C and the node of a resistive divider comprising resistors 52 and 53 connected such that a fixed proportion of the battery voltage V appears at the other input of the comparator 55b. An output of the comparator 55c changes state when the voltage at the input 55a exceeds the voltage at the input 55b. A contactor or other controllable switch 50 functions to temporarily isolate the battery 15 to be measured from the main battery bus 51.

The measurement time may be set at a fixed proportion of the RC time constant of the measurement circuit, where the external resistor R and the external capacitor C are known, and the internal resistance of the battery is to be determined. The internal resistance of the battery is Rb and is presumed to include any resistance present in the connections and the connecting wires. The measurement is performed by temporarily disconnecting the battery 15 from the battery bus 51 by opening the contactor 50. This function may be performed by a control line of a timing and control circuit 58. The measurement time begins when a switch 54, which may be a MOSFET switch or other electrical switch is closed, connecting the resistor R with the capacitor C. Alternatively, the switch 54 may be connected between the resistor R and the node between the battery string 15 and the resistor R.

The timing and control circuit 58 enables a time counter in a counter and D/A circuit 57 to begin measuring the elapsed time by accumulating clock counts. The granularity of time measurement is determined by a clock frequency used to drive the time counter. The clock may be either internal to the timing and control circuit 58 or the counter circuit 57. The voltage Vc appearing across the capacitor C begins to rise, with a time constant $(R+Rb)*C$, where R and C are the fixed external components and Rb is the battery resistance, which is the quantity to be measured. Optionally, an enable command is applied to one input 56a of an AND gate 56, where the other input 56b of the AND gate 56 is the comparator output 55c. The enable command, if used, may be delayed until a time of about 0.5 RC has elapsed, so as to avoid false triggering due to noise. This time delay is set to be less than the expected time for the voltage at the input terminal 55a to exceed the voltage on terminal 55b. That is, the voltage divider 52, 53 is chosen so that the voltage appearing at terminal 55b of the comparator 55 is not exceeded by the voltage on the other input 55a until at least a time greater than 0.5RC has elapsed. The example has been presented using a time value of 0.5RC, but any other value of time value may be used, being selected to minimize measurement time while achieving acceptable accuracy and noise immunity.

When the voltage Vc across the capacitor C, which appears at the input terminal 55a of the comparator 55 exceeds that voltage appearing at the input 55b of the comparator 55, the comparator output 55c changes state and, providing that the enable signal is applied to the AND gate 56, the change of state is passed to the counter and D/A converter module 57. This change of state is sensed and used to stop the time counter. Thus, the time counter in the counter and D/A converter module 57 measures a count number proportional to the time since the initiation of the measurement. The time at which the counter has stopped is associated with a fixed percentage of the voltage of the supply V, the elapsed time is a measure of the time constant $(R+Rb)*C$. The time constant T1 determined by this measurement is compared with the time constant T0 which was obtained at a previous time, such as when the battery was first installed. This comparison may be made in the comparator module 59, and results in a computation of the battery resistance Rb that presently exists.

The contactor 50 may be closed, and the switch 54 may be opened after the completion of the measurement cycle.

The resultant battery resistance Rb1 may then be compared with an earlier measured value of battery resistance Rb0 and the result expressed as a direct numerical value or as a ratio, showing the percentage increase in resistance. This may be done in both an absolute sense with respect to the battery resistance on installation, or in a relative sense with respect to a previous measurement.

In the example shown in FIG. 4, the test indicators 60 may be illuminated to display the result as a visual indication. Alternatively, providing that a suitable interface is provided, the information may be communicated to a supervisory control system.

Although this example has been presented using discrete components and modules, it will be appreciated by those persons of skill in the art, that the measurements, and control of the switches and the evaluation of the voltage measurement may be made in a microprocessor or any stored program computer, and that the functions of the comparator may be performed by analog-to-digital (A/D) converting the voltages V and Vc into digital format and performing the remainder of the measurement process as a computation, including determination of the time to reach a specified percentage of the voltage V.

A resistor Rd is shown across the capacitor C, and indicates that the capacitor is discharged between measurements. If such a resistor is used, the value of Rd is preferably substantially greater than R, so that the time constant for charging is minimally affected. Alternatively, the value may be taken into account in the computations.

In the present example, the counter output is connected to a digital-to-analog converter, such that the numerical output of the counter is proportional to the elapsed time, and thus the D/A converter voltage is thus also proportional to the elapsed time. Comparator 59 establishes threshold points corresponding to, for example, increases in battery resistance of 25%, 50%, 75% and 100% with respect to an initial measurement and are used to provide a visual indicator/alarm 60 based on the measured battery resistance. Alternately, a voltmeter scaled in milliohms could be used to provide a direct reading of the battery resistance.

A memory may be used to store the initial output of the counters. This stored output may connected to a second D/A converter to provide an output voltage proportional to the charge time that is used as an offset representing the initial battery resistance and to account for tolerances in the values of the external R and C values. The offset voltage may be used in the comparator 59 to adjust the thresholds based on the initial resistance reading.

As an indication of the circuit values which may be used in a particular circumstance, a maximum value of the test current to be drawn from the battery string may be set at 50 amperes. The value of the series resistor R is determined by dividing the battery string voltage V by 50 A. For a string of 40 batteries having 12.635 volt nominal terminal voltage, the voltage V would be 516 Volts. The resistor R would be 516/50=10.32 Ohms. To achieve a time constant (RC) of 1 second, C would equal 96,899 uF.

The current flowing from the battery 15, through the resistor R into capacitor C decreases exponentially as the capacitor charges. The decrease in the current follows an exponential curve that is reciprocal to the charging voltage curve such that at the point when the capacitor voltage reaches 39.4% of the applied voltage, the current has decreased by 39.4% from the maximum initial current. After 0.5 seconds has elapsed, in this example, the voltage Vc would be 39.4% of the battery terminal voltage V, and the current will have decreased to 39.4% of the maximum current which obtained at the beginning of the measurement. The battery resistance Rb, being added to that of the external resistance R increases the overall time constant, and the time to reach a fixed parentage of the battery terminal voltage will be longer if the resistance battery resistance Rb has increased form the baseline measurement. This increase in time is the measure of the battery resistance and may be used to assess the performance potential of the battery being tested.

The time constant, percentage of the time constant and current values can be adjusted to optimize the size and cost of capacitors and other components used in the measurement circuit.

The measurement apparatus has been shown as connected to a single battery string. Depending on the installation, this measurement apparatus may be provided for each battery string to be measured, or portions of the apparatus used as a common circuit for all of the batteries. In yet another aspect, the contactor 50, the resistor R, the switch 54 and the capacitor C and the resistive divider 52, 53 may be located hear the battery, and the comparator 55, the AND gate 56, the counter and D/A converters 57, the timing and control circuit control 58 and the comparators 59 located elsewhere. Locating the resistive divider 52, 53 near to the location of the battery 15, and employing a voltage divider on the output of C may permit the connections between the remainder of the measuring apparatus and the battery to be of a low voltage and low current character.

Figure 5:
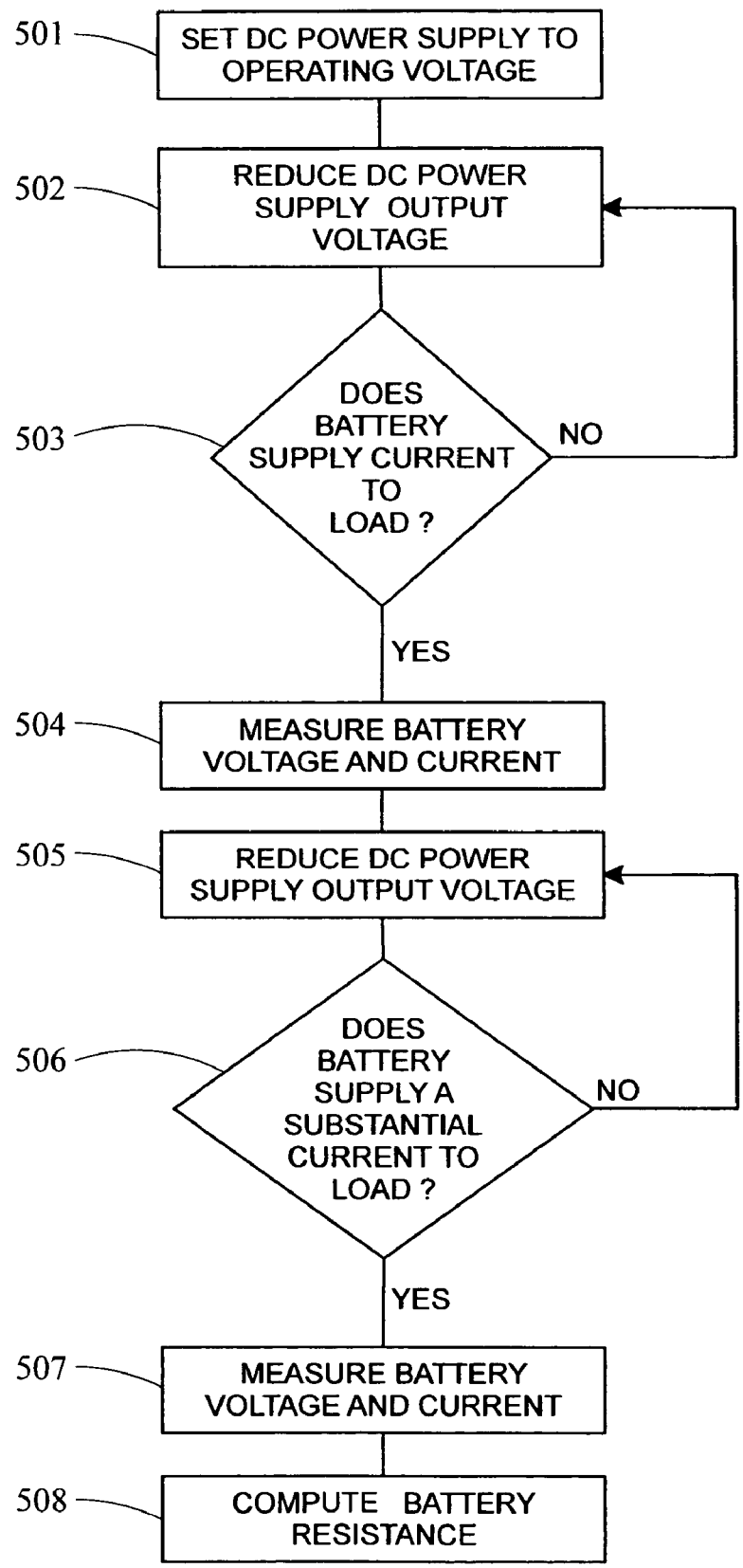
FIG. 5 is a flow chart for a method of measuring the battery resistance by varying the power supply voltage

In another aspect, a method of determining the battery resistance is shown in FIG. 5. The method comprises the steps of: (step 501) setting the DC power supply 11 to the output voltage for supplying power to the load 17; (step 502) initiating the measurement of battery resistance Rb by reducing the DC power supply output voltage 30; (step 503) measuring the battery current 38 to determine when the battery 15 has begun to supply some current to the load 17, and then halting the reduction of the DC power supply voltage 30; (step 504) making a first measurement of the battery voltage 31 and the battery current 38; (step 505) further reducing the DC power supply voltage 30; (step 506) measuring the battery current 38 to determine when the battery 15 is supplying a substantial fraction of the design load current 42, and halting the reduction of the DC power supply voltage 30; (step 507) making a second measurement of the battery voltage 31 and the battery current 38; and (step 508) computing the battery resistance based on the first and second measurements.

As mentioned previously, different battery types, such as lead-acid, NiCd, and the like, exhibit different time dependent behavior when subject to discharge. The rate at which the voltage is reduced in step 502 may be determined for the battery type chosen for a particular design, the rate being selected so that the battery voltage is relatively stable when the battery is supplying current to the load. The percentage of the full discharge current at which this point is determined experimentally during the design. The voltage may then be reduced more rapidly in step 505. This will reduce the amount of battery capacity that is discharged in reaching a YES condition in step 506. Similarly, the specification of the substantial amount of current depends on the battery type, capacity and the number of batteries in the system. However, once this is determined, the value of current associated with this criterion does not change.

Figure 6:
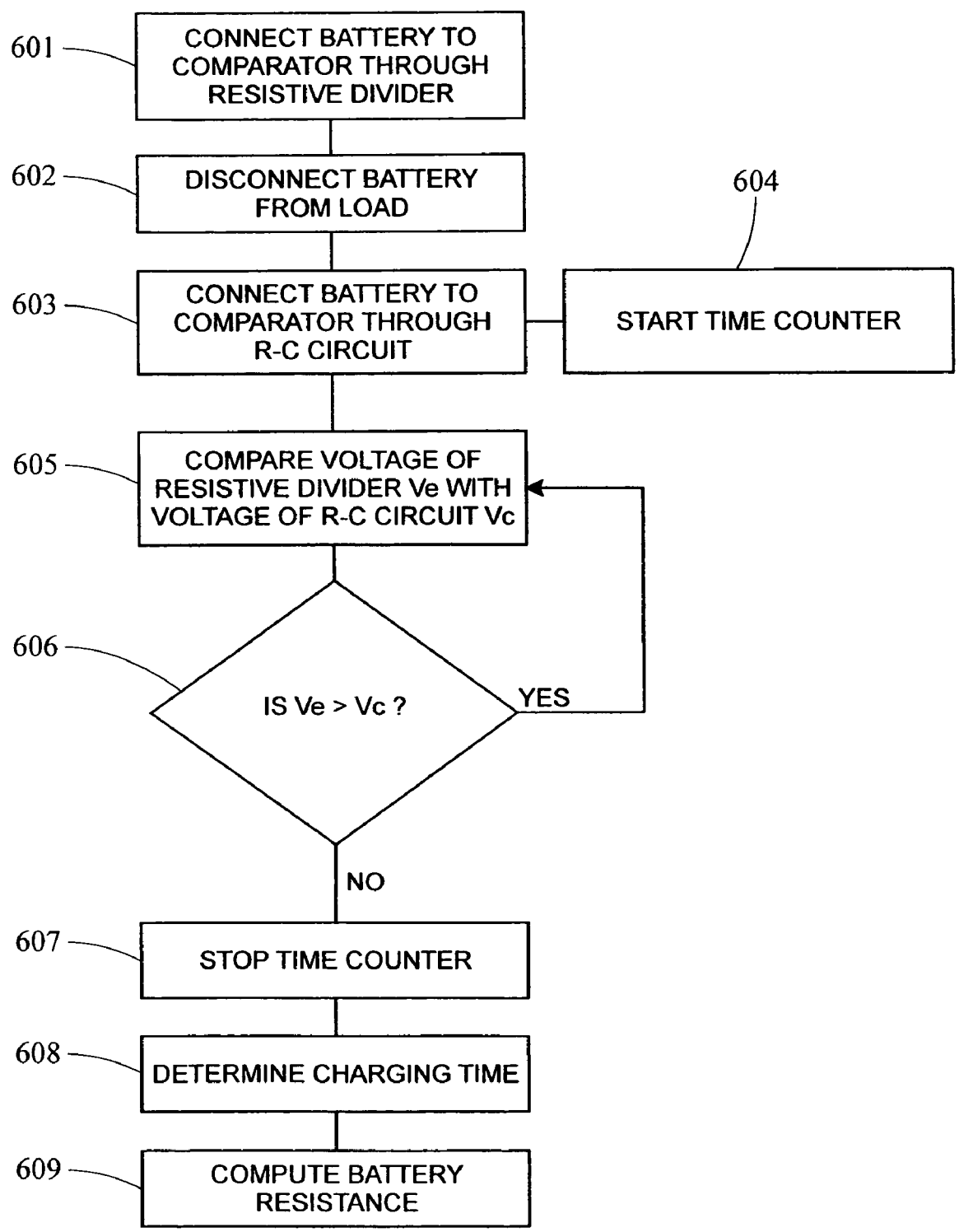
FIG. 6 is a flow chart for a method of measuring the battery resistance by determining the charging time of a resistive-capacitive circuit.

In yet another aspect, a method of determining the battery resistance is shown in FIG. 6. The method comprises the steps of: (step 601) connecting the battery to an input of a resistive divider network; (step 602) disconnecting the battery from the electrical load; (step 604) starting a time counter at the same time as (step 603) connecting the battery to an input of a resistor-capacitor network; (step 605) comparing the voltages at the output of the resistive divider network with the voltage of the output of the resistive-capacitive circuit, where the voltage or the resistive-capacitive circuit is measured between the terminals of the capacitor; (step 607) determining that the voltage on resistive-capacitive circuit exceeds that of the resistive divider network; (step 607) stopping the time counter when the voltage on the resistive-capacitive unit exceeds that of the resistive divider network; (step 608) determining the charging time by the difference between the stopping count and the starting count; and (step 609) computing the battery resistance by comparing the charging time determined in step 608 with a charging time previously obtained by performing the method.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A resistance measuring apparatus comprising:
a first voltmeter;
an ammeter;
a first terminal of the ammeter connected to a first terminal of a first voltmeter;
a second terminal of the first voltmeter connected to ground;
a second terminal of the ammeter connected to a first external connection terminal;
a second external connection terminal connected to ground;
an output terminal connected to the first terminal of the ammeter;
a DC power supply, the DC power supply connected to the first terminal of the ammeter; and
a controller configured to communicate with the DC power supply and control an output voltage of the DC power supply,
wherein the DC power supply is not a battery.

2. The apparatus of claim 1, wherein a battery is connectable between the first external connection terminal and the second external connection terminal.

3. The apparatus of claim 2, wherein the battery is a lead-acid battery.

4. The apparatus of claim 2, wherein the battery further comprises a plurality of batteries connected in series.

5. A method of measuring resistance, the method comprising:
providing a DC power supply and an electrical load, connectable to a battery;
providing a controller for adjusting an output voltage of the DC power supply;
measuring a first voltage value and first current value when the DC power supply output voltage is adjusted to a first value such that a connected battery supplies the first current value;
measuring a second voltage value and a second current value when the DC power supply output voltage is adjusted to a second value, the second value being lower than the first value, such that the connected battery supplies the second current, wherein the second current value is greater than the first current value; and
calculating a battery resistance.

6. The method of claim 5, further comprising controlling the DC power supply output voltage such that the output voltage is gradually reduced to a first voltage, and then reduced to a second voltage.

7. The method of claim 6, wherein the output voltage is rapidly reduced to a second voltage.

8. The method of claim 5, wherein the first current value is approximately half of a maximum current value.

9. The method of claim 8, wherein the second current value is substantially the maximum current value.

10. A battery resistance measuring apparatus comprising:
an ammeter;
a switch, the switch having a first terminal selectably connectable to one of a second terminal and a third terminal;
a second terminal of the switch connectable to a first electrical load;
a third terminal of the switch connected to a second electrical load, the second electrical load having a controllable resistance value;
a first terminal of the ammeter connected to the first terminal of the switch;
a second terminal of the ammeter connected to a first battery connection terminal;
a second battery connection terminal connected to a ground; and
a voltmeter connected between the first terminal of the ammeter and the ground.

11. The apparatus of claim 10, wherein the second electrical load is a resistor having a plurality of selectable values.

12. The apparatus of claim 10, wherein a stored-program computer controls the switch, controls the resistance value of the second electrical load receives measurements of voltage and current, computes the resistance of the battery, and outputs the computed battery resistance.

13. The apparatus of claim 10, wherein a stored-program computer controls the switch, controls the resistance value of the second electrical load measures the voltage and current voltmeter, computes the battery resistance and outputs the computed battery resistance.

14. An apparatus for measuring resistance, comprising:
a first battery connection terminal;
a second battery connection terminal connected to ground;
a first resistive divider comprising a first and a second resistor having a first node between a first end of each of the first and second resistors, a second end of the first resistor connected to the first battery connection terminal and a second end of the second resistor connected to ground;
a network having a second node between a first end of a third resistor and a first end of a capacitor, the first end of the third resistor connected to the first battery connection terminal and a second end of the capacitor connected to ground;
a voltage comparator having a first input connected to the first node and a second input connected to the second node; and
a first switch connected between the first battery connection terminal and an output terminal.

15. The apparatus of claim 14, wherein a stored-program computer controls the first switch and the output of the voltage comparator, computes the battery resistance, and outputs the computed battery resistance.

16. The apparatus of claim 14, wherein a second switch is disposed between the first end of third resistor and the second node.

17. The apparatus of claim 14, wherein a second switch is disposed between a second end of the third resistor and the first battery connection terminal.

18. A method of measuring battery resistance, the method comprising:
connecting an input terminal to a resistive divider;
disconnecting the input terminal from an output terminal;
connecting the input terminal to an input of a resistive-capacitive circuit;
determining the time required for the voltage across the terminals of a capacitor of the resistive-capacitive network to become equal to the voltage at an output of the resistive divider; and
calculating a battery parameter.

19. The method of claim 18, wherein the battery parameter is a resistance.

20. The apparatus of claim 1, wherein an input of the DC power supply is connectable to a source of alternating current power.

21. The apparatus of claim 1, wherein an input of the DC power supply is connectable to at least one of a backup electrical generator or a power distribution grid.

22. The apparatus of claim 1, wherein an input of the DC power supply is connectable to a power distribution grid.

23. The apparatus of claim 1, wherein the first terminal of the first voltmeter is connected to a third external terminal.

24. The apparatus of claim 23, wherein the third terminal is connectable to an electrical load.

* * * * *